United States Patent [19]
Lischke et al.

[11] Patent Number: 4,551,625
[45] Date of Patent: Nov. 5, 1985

[54] SPECTROMETER OBJECTIVE FOR PARTICLE BEAM MEASUREMENT TECHNIQUE

[75] Inventors: Burkhard Lischke; Erich Plies, both of Munich, Fed. Rep. of Germany

[73] Assignee: Siemens Aktiengesellschaft, Berlin & Munich, Fed. Rep. of Germany

[21] Appl. No.: 513,605

[22] Filed: Jul. 14, 1983

[30] Foreign Application Priority Data

Sep. 30, 1982 [DE] Fed. Rep. of Germany ....... 3236271

[51] Int. Cl.$^4$ ............................................. H01J 37/26
[52] U.S. Cl. .................................. 250/310; 250/356 R
[58] Field of Search .................... 250/310, 396 R, 396, 250/397; 324/158 R, 158 D

[56] References Cited

U.S. PATENT DOCUMENTS 3,717,761  2/1973  Koike et al. ........................ 250/310
3,822,382  7/1974  Koike ................................. 250/305
4,292,519  9/1981  Feuerbaum ........................ 250/310

OTHER PUBLICATIONS

H. P. Feuerbaum, *Scanning Electron Microscopy*, SEM, Inc., pp. 285–296, (1979).

Primary Examiner—Bruce C. Anderson
Attorney, Agent, or Firm—Hill, Van Santen, Steadman & Simpson

[57] ABSTRACT

An arrangement for particle beam measurement utilizes, an objective for the imaging of primary probe particles on a specimen and a spectrometer for the detection of secondary particles. The arrangement also utilizes the superposition of the electric field of the spectrometer with the electric field of the objective lens to render possible an effective increase of the probe current and-/or an improved potential resolution. A portion of the field of the objective is provided for the focusing of the secondary particles onto an electrode for determining energy selection.

10 Claims, 5 Drawing Figures

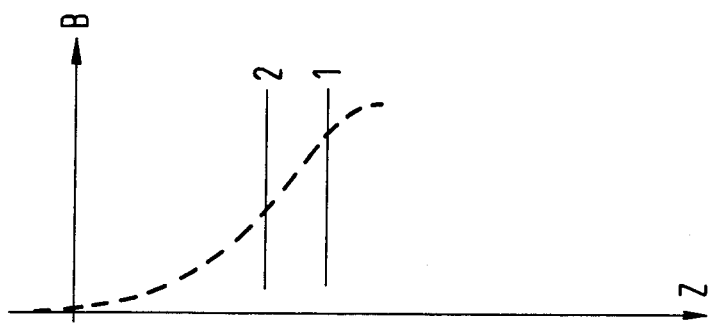
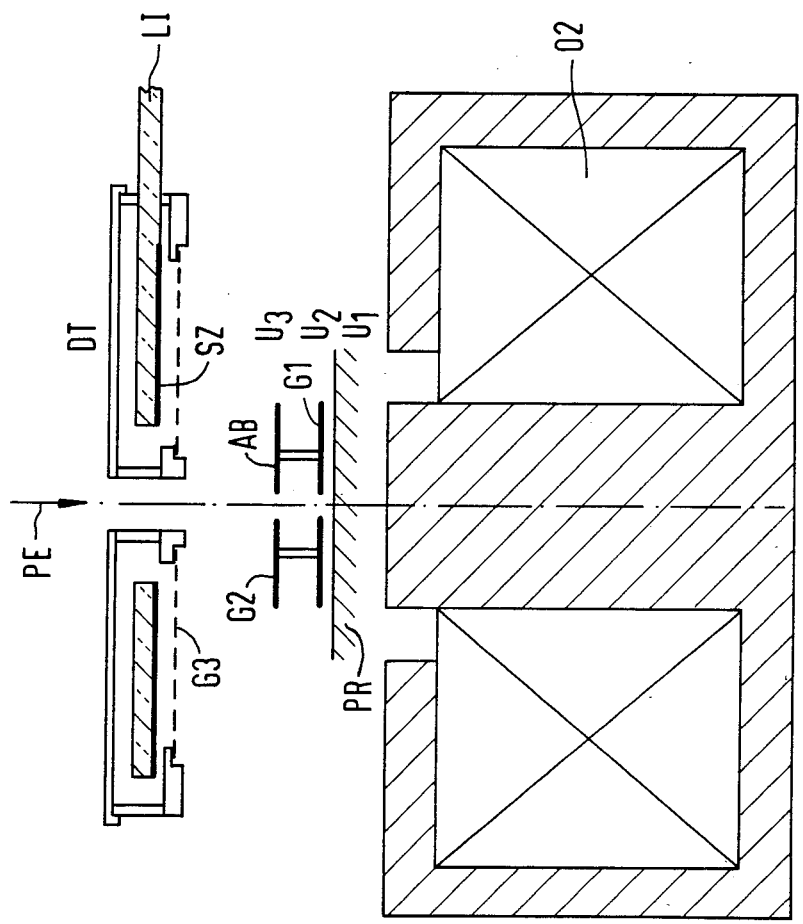
FIG 4

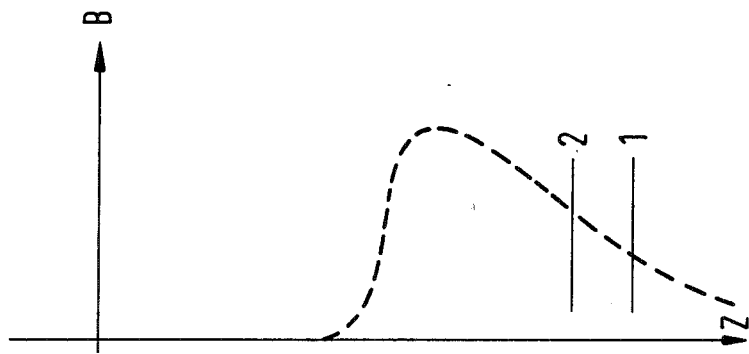
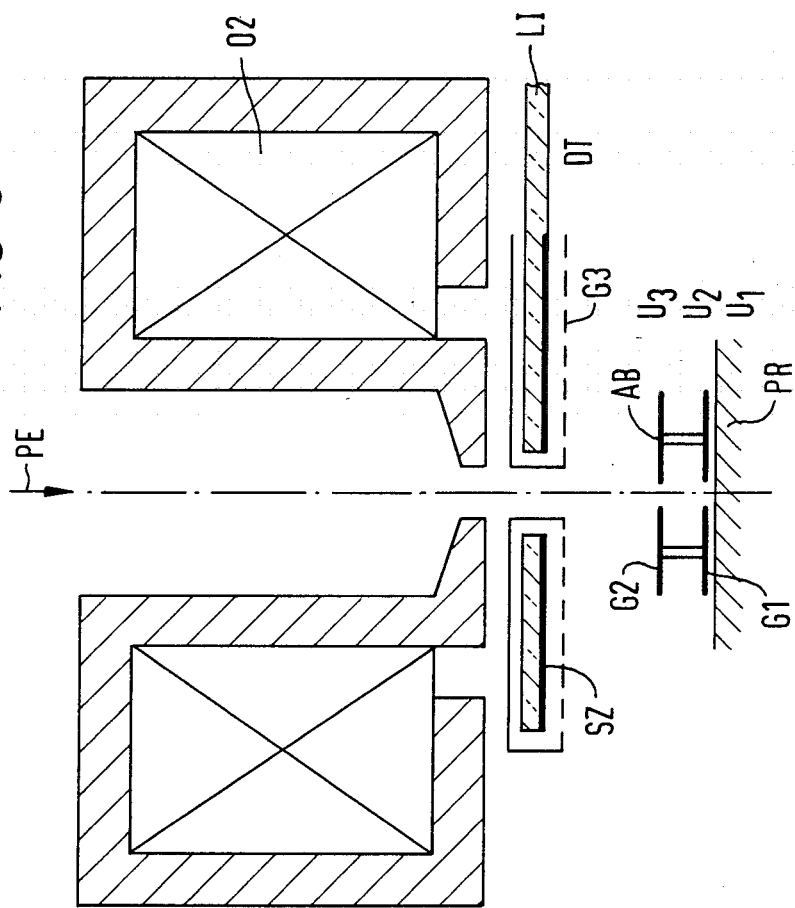
FIG 5

SPECTROMETER OBJECTIVE FOR PARTICLE BEAM MEASUREMENT TECHNIQUE

BACKGROUND OF THE INVENTION

The invention relates to an arrangement for particle beam measurement in which primary particles are imaged on a specimen and a spectrometer serves to detect secondary particles being controllably focused.

In the measurement of electric potentials with an electron probe, a potential resolution can be obtained which is given by the formula:

$$\Delta V = k \sqrt{p \Delta f / i_s} .$$

This potential resolution becomes better the greater the current $i_s$ of the electron probe, if the spectrometer constant k, the pulse-duty factor p, and the bandwidth $\Delta f$ are specified.

There are conventional lens errors in the objective or focus field forming the electron probe, such that the probe current $i_s$ is dependent upon these conventional lens errors. By way of approximation, this connection is indicated by the formula:

$$i_s = 1,13 \pi R \alpha^2 \{d^2 - [(2C_F \Delta U \alpha / U)^2 + (C_ö \alpha^3 / 2)^2]\}$$

It is apparent that, with a given diameter d of the electron probe, a given radiated beam value R, a given aperture $\alpha$ and a given energy width $\Delta U$ of the electron probe, the current $i_s$ of the electron probe becomes smaller the greater the axial chromatic aberration $C_F$ and the aperature error $C_ö$ of the lens of the objective forming the electron probe become. The current $i_s$ of the electron probe can be effectively increased if the lens aberrations are reduced by means of a greater lens current with which the lens is excited. On the other hand, the focal length of this lens and hence the working distance is thereby shortened so that there may be insufficient room for the spectrometer detector arrangement between specimen and objective lens.

A potential measurement technique has previously been adapted for conventional scanning electron microscopy. A spectrometer for the quantitative potential measurement is applied between the specimen and the object lens as set forth by H. P. Feuerbaum in *Scanning Electron Microscopy* (1979), pp. 285-296 or in the U.S. Pat. Nos. 4,277,679 and 4,292,519, respectively. Such a known spectrometer has a minimum working distance which, at least, must be afforded. Hence, reduction of the objective lens aberrations, causing a shortening of the focal length of this objective lens and hence of the working distance, is not readily possible in this previously known technique for particle beam measurement.

The invention concerns an arrangement in which probe current can be effectively increased and/or permits an improved potential resolution for use with the above-described particle beam measurement technique. The invention enables objective lens arrangements with an integrated spectrometer in which objective lens aberrations are decreased by means of shorter focal lengths. Given the same probe current $i_s$, an improved local resolution as well as an improved potential resolution can thus be achieved.

SUMMARY OF THE INVENTION

Through superposition of the electric field of a spectrometer detector with the magnetic field of an objective lens, an electron optical unit, a "filter lens" is produced with which secondary electrons which have been released on the specimen are imaged on the filter electrode of the spectrometer. Thus, for example, conventional spectrometer grating can be replaced without intensity loss by diaphragms. One thus attains a suppression of harmful backscatter electrons, the signal background becomes smaller, and the measuring accuracy is improved. On account of the chromatic aberrations of the magnetic-electric filter lens, only secondary electrons of a specific energy are focused o the filter diaphragm and these pass through the filter diaphragm. The other secondary electrons are retained by this filter diaphragm.

In accordance with the invention the spectrometer characteristic curve can be improved and the potential resolution capability can be increased with a corresponding selection of the electrodes of the spectrometer, the potentials on these electrodes, and the distances of these electrodes relative to the specimen, the objective lens, and one another.

Advantages of the inventive arrangement are: spectrometer objective for increased probe current, improved local resolution capability, and improved potential resolution capability. These and other advantages and specific features of the invention will be understood from the following description of preferred embodiments of the invention.

BRIEF DESCRIPTION OF THE DRAWING

FIGS. 4 and 5 show inventive embodiments of a spectrometer objective with a stray field objective.

DESCRIPTION OF THE PREFERRED EMBODIMENTS

Figure 1:
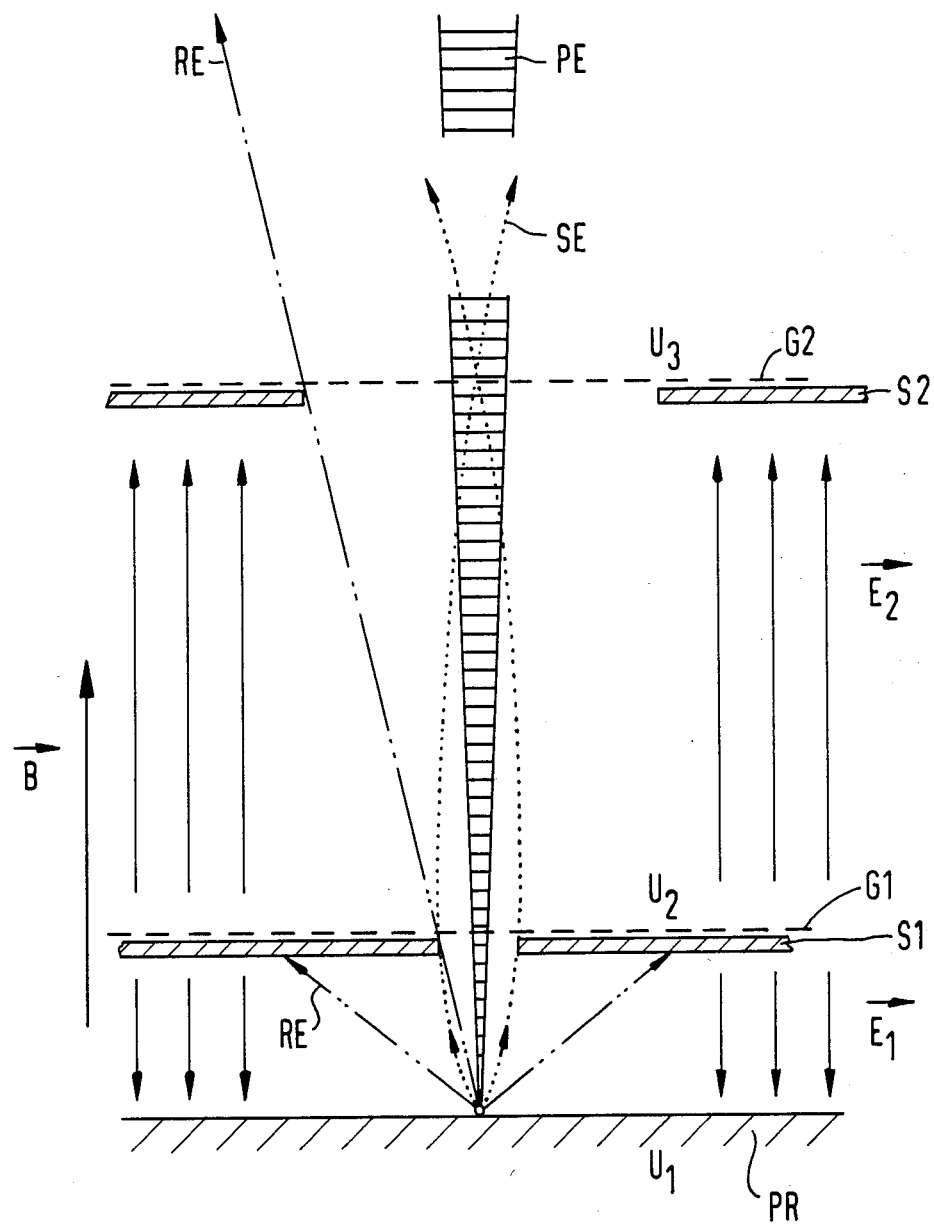
FIG. 1 shows schematically the principle of the invention for a spectrometer objective.

FIG. 1 shows the principle of an inventive spectrometer objective. A primary electron probe PE releases from a specimen PR low-energy secondary electrons SE and brings about high energy backscatter electrons RE. The specimen PR has a potential $U_1$. The secondary electrons SE triggered on the specimen PR are accelerated by an electrode G1, which, for example, can be designed in the form of a grid electrode and has a potential $U_2$. The secondary electrons are retarded by a potential $U_3$ at which an upper, overlying second electrode G2 is disposed. The electrode G2 may be designed in the form of a grid electrode. The secondary electron current passing through the electrode G2 is a measure of the potential $U_1$ to be measured on which the specimen is disposed.

Through superposition of a magnetic lens field B, the secondary electrons SE can be focused by the specimen on the electrode G2. Without intensity loss, as a consequence of this focusing, the conventional grids for the electrodes G1 and G2 can be replaced by fine diaphragms and hence the undesired backscatter electrons RE can be intercepted. A diaphragm as electrode G1 thus acts as an apertured stop and a diaphragm as electrode G2 determines the energy selection.

Between the specimen PR with a potential $U_1$ and the electrode G1 with the potential $U_2$ is an electric field $E_1$. Between the electrode G1 with the potential $U_2$ and the electrode G2 with the potential $U_3$ is a retarding electric field $E_2$. The electric field $E_1$ serves the purpose of accelerating the secondary electrons SE. Between the specimen PR and the electrode G1 a screen S1 is arranged for the purpose of selection of axis-proximate secondary electrons SE. Between the electrode G1 and the electrode G2 an additional screen S2 is arranged for a corresponding effect.

Figure 2:
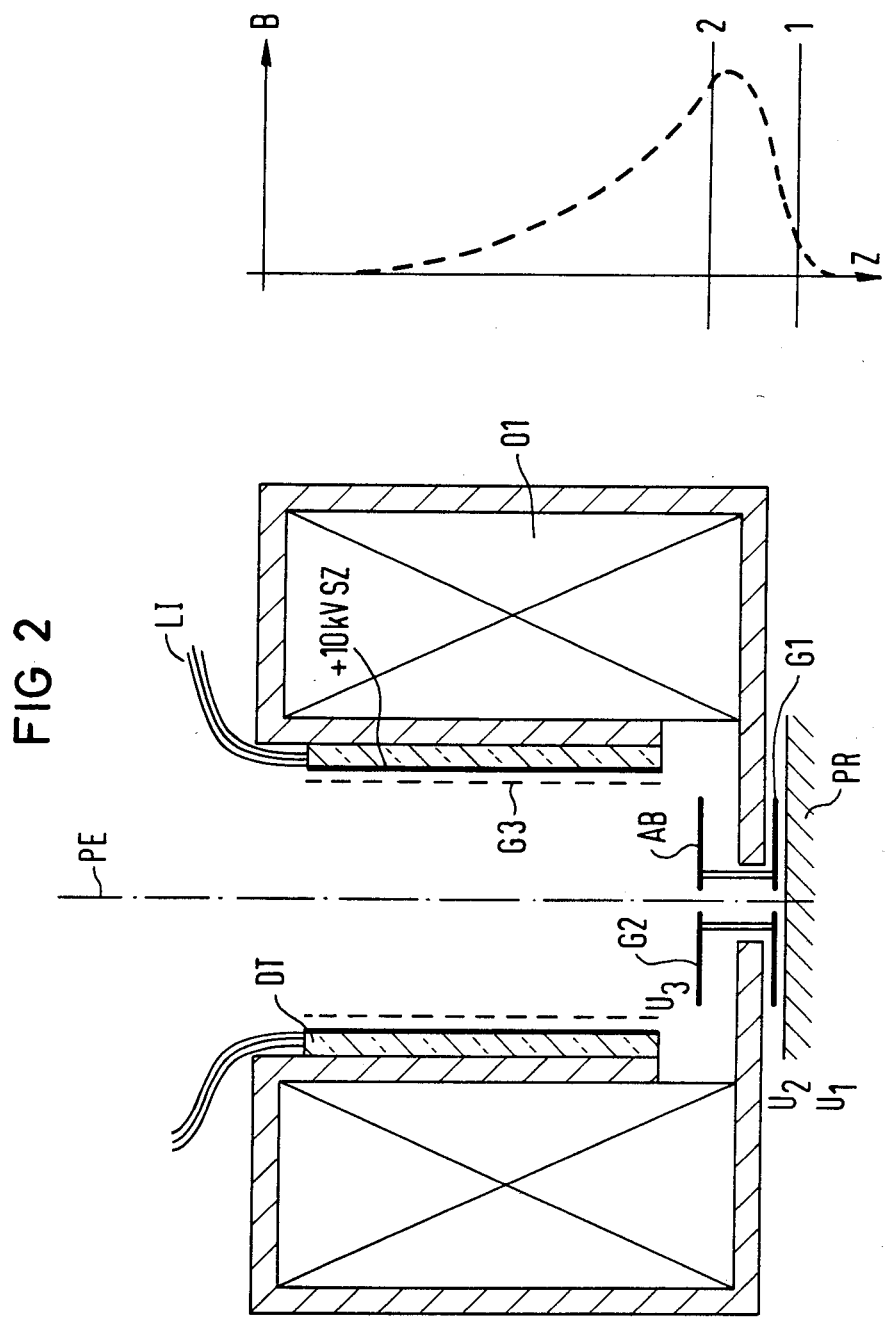
FIGS. 2 and 3 show inventive embodiments of a spectrometer objective with a conventional scanning electron microscope objective.
Figure 3:
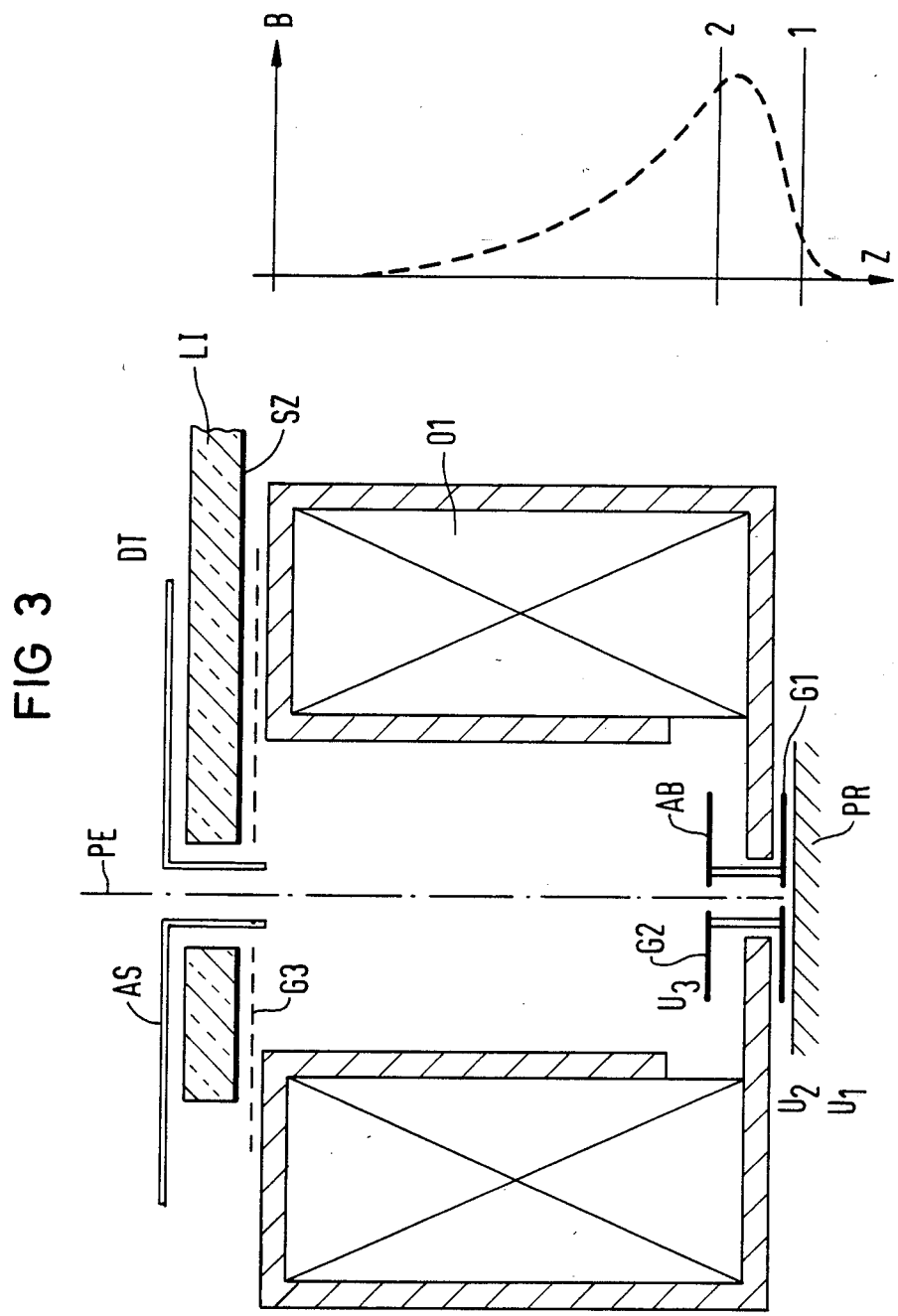

FIGS. 2 and 3 show inventive spectrometer objectives with conventional scanning electron microscope objectives 01. The primary electron beam PE is focused on the specimen PR through a variable magnetic field B of the lens of a conventional scanning electron microscope objective 01. To focus the secondary electrons SE on the electrode G2, the voltage $U_3$ applied to the electrode G2 is suitably adjusted. From the spectrometer arrangement the secondary electrons SE are transferred through the magnetic fields of a detector DT and detected there. Suitable detectors are, for example, the Everhart-Thornley-detector and the Robinson-detector, semiconductor-Schottky-diodes, Channeltrons, or a simple collecting electrode for the purpose of current measurement, as discussed in the textbook by O. C. Wells, *Scanning Electron Microscopy*, McGraw-Hill, 1974, or the textbook by L. Reimer et al, *Scanning Electron Microscopy*, First Edition, Springer, 1973.

FIGS. 4 and 5 show inventive spectrometer objectives with stray field objectives 02. In the case of a stray field objective 02, the magnetic field B, for the formation of the electron beam, is disposed outside the lens objective body. On account of the strong magnetic field B, in the case of arrangements according to the FIGS. 4 and 5, the secondary electrons SE can not be laterally suctioned off by an electric field and then detected in the detector DT. This must be taken into consideration in the detector design. Instead of the detector arrangements DT, illustrated in the FIGS. 4 and 5, which detector arrangements correspond to the detector according to FIG. 3, a detector arrangement can also be employed which corresponds in its function to the detector DT according to FIG. 2. The designations in the case of the arrangements according to FIGS. 4 and 5 and the function of these arrangements correspond to the arrangement disclosed with regard to the FIGS. 1 through 3. For the stray field lenses, other spectrometer detector arrangements are suitable if they only take into account, in a corresponding fashion, the presence of a strong magnetic field B. A spatial restriction virtually does not exist for the spectrometer detector construction in the case of arrangements according to the FIGS. 4 and 5.

The electrode G1 at the potential $U_2$ for the acceleration of the secondary electrons SE, in the FIGS. 2 through 5, is applied in the form of a grid electrode or as a grid electrode with screen on a diaphragm slide. For the electrode G2, a filter diaphragm is provided. The filter diaphragm is a conventional apertured diaphragm AB which, for this purpose, is brought to the potential $U_3$. The filtered secondary electrons SE are detected above the lens of the scanning electron microscope objective 01 with the detector DT. In FIGS. 2 through 5 the axial progression of the magnetic field B is respectively plotted on the right. The fraction of the magnetic field B between the specimen PR and the apertured diaphragm AB, bounded in the FIGS. 2 through 5 by the straight lines 1 and 2, serves the purpose of imaging the secondary electrons SE on the electrode G2.

The arrangement for the detectors DT in the FIGS. 2 through 5 are respectively symmetrically illustrated. Such arrangements are best suited within the framework of the invention. However, also falling within the scope of the invention may be modifications with regard to the detectors DT illustrated in the FIGS. 2 through 5. For example, in FIG. 2, optical guides LI are arranged symmetrically to the optical axis on the interior wall of the conventional scanning electron microscope objective 01. The surface of these optical guides LI, which points toward the optical axis, is provided with a scintillator SZ which is on the potential +10 kV. In front of this scintillator SZ in the direction toward the optical axis is a grid electrode G3 for the purpose of post-acceleration of the secondary electrons SE. The detector arrangement according to FIG. 2 can be so organized that the magnetic field intensity B and the electric field intensity between the electrode G2 and the grid G3 run approximately parallel.

The detector arrangement according to FIG. 3 exhibits optical guides LI symmetrically to the optical axis, which optical guides are arranged outside the scanning electron microscope objective 01 parallel to the surface of the specimen PR. These optical guides LI are provided with a screen AS about the primary electron probe PE. In the direction of the interior space of the scanning electron microscope objective 01, the surfaces of these optical guides LI exhibit scintillator layers SZ in front of which, in the direction of the interior space of the scanning electron microscope objective 01, an additional grid G3 is arranged. Thus, the secondary electrons SE pass through the grid G3 before they impinge on the scintillator SZ.

Detector arrangements according to FIGS. 2 or 3 can also be modified wherein they are no longer symmetric with respect to the optical axis or the tracks of the secondary electrons on the path between the electrode G2 and the detector or the arrangement of the scintillator layer SZ is modified. What is significant for the invention is that the working distance, in accordance with the invention, is reduced since the electrode G1 is disposed between the scanning electron microscope objective 01 and the specimen PR and the electrode G2 is arranged within the scanning electron microscope objective 01.

In the case of arrangements according to FIGS. 2 and 3, the secondary electrons can, for example, be laterally suctioned off by an electric field and detected.

Although various minor modifications may be suggested by those versed in the art, it should be understood that I wish to embody within the scope of the patent warranted hereon all such modifications as reasonably and properly come within the scope of my contribution to the art.

We claim as our invention:

1. An improved arrangement for particle beam potential measurement having an electron probe objective lens for imaging primary particles on a specimen and a spectrometer for detecting secondary particles released from said specimen, the improvement comprising a first electrode means adjacent said specimen for accelerating said secondary particles and for focusing secondary particles along an optical axis, a second electrode means above said first electrode means for determining energy selection based on secondary particles passing along said optical axis, means for adjusting the voltage of the second electrode means which is in combination with a magnetic field of said objective lens between said first and second electrode means for focusing and retarding secondary particles on said second electrode means.

2. The improvement of claim 1, wherein said electron probe objective is a scanning electron microscope objective.

3. The improvement of claim 1, wherein said electron probe objective is a stray field lens.

4. The improvement of claim 1, wherein said first electrode means includes a screen apertured about said optical axis.

5. The improvement of claim 1, wherein said first and second electrode means are in the form of fine diaphragms.

6. The improvement of claim 1, wherein the voltage of the first electrode means is set to focus secondary particles along said optical axis.

7. The improvement of claim 1, further comprising magnetic field means above said second electrode means for conducting secondary particles onto a detector.

8. The improvement of claim 7, further comprising a third electrode means associated with said detector for rendering the magnetic and electric field intensities between said second and third electrode means substantially parallel.

9. The improvement of claim 7, wherein said detector is shaped symmetrically about said optical axis.

10. The improvement of claim 1, wherein at least one of said first and second electrode means includes a grid and a screen adjacent said grid and apertured about said optical axis.

* * * * *